United States Patent
Chu

(10) Patent No.: US 6,232,200 B1
(45) Date of Patent: May 15, 2001

(54) METHOD OF RECONSTRUCTING ALIGNMENT MARK DURING STI PROCESS

(75) Inventor: Chih-Hsun Chu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/227,698

(22) Filed: Jan. 8, 1999

(30) Foreign Application Priority Data

Oct. 22, 1998 (TW) .................................... 87117480

(51) Int. Cl.⁷ .................................... H01L 21/762
(52) U.S. Cl. ............................ 438/401; 438/975
(58) Field of Search .................... 438/401, FOR 435, 438/975

(56) References Cited

U.S. PATENT DOCUMENTS 5,786,260 * 7/1998 Jang et al. .
5,893,744 * 4/1999 Wang .

OTHER PUBLICATIONS

Wolf, S., Silicon Processing for the VLSI Era:vol. 2, Process Integration, Lattice Press, pp. 54–56, 1990.*

* cited by examiner

*Primary Examiner*—George Fourson
*Assistant Examiner*—Thanh Pham
(74) *Attorney, Agent, or Firm*—Jiawei Huang; J.C. Patents

(57) ABSTRACT

In this method of reconstructing an alignment mark during shallow trench isolation process, a mask layer is formed on the substrate and a cap layer is further formed to fill a recess within the mask layer above the alignment mark. A trench is then formed within the substrate. An insulating layer is formed to fill the trench and a CMP process is carried out to globally planarize the wafer until exposing the mask layer. The cap layer, the mask layer and the pad oxide layer are then successively removed. An isolation region is therefore formed in the trench and the alignment mark can be reconstructed.

20 Claims, 6 Drawing Sheets

METHOD OF RECONSTRUCTING ALIGNMENT MARK DURING STI PROCESS

CROSS-REFERENCE TO RELATED APPLICATION

This application claims priority benefit of Taiwan application Serial no. 87117480, filed Oct. 22, 1998.

BACKGROUND OF THE INVENTION

1. Field of the Invention

The invention relates to a method of fabricating an integrated circuit, and more particularly to a method of reconstructing an alignment mark during shallow trench isolation (STI) process.

2. Description of the Related Art

Photolithography is a key process in manufacturing semiconductor devices, so it plays an important role on the fabrication of the semiconductor. In the general process of fabricating a device, completion of the device requires approximately 10–28 patterning and exposure steps. In order to transfer the pattern of the mask accurately onto the wafer, masks between different levels should be aligned prior to the exposure of the photoresist to avoid wafer failure, which is due to transfer error of the pattern.

In a conventional exposure process, an alignment mark corresponding to a mask is formed on the wafer, which alignment mark is provided to form the semiconductor devices. A step height produced by the alignment mark may provide a scattering site or diffraction edge during alignment. When the light source, such as a He—Ne laser of a wavelength of about 635 nm, is provided to irradiate the whole wafer, a diffraction pattern produced by the light projected on the alignment mark is reflected to a alignment sensor and a first order diffraction interferometer alignment system to achieve alignment. However, the step height of the alignment mark, less than 200 Å, for example, is not high enough to obtain an obvious diffraction. As a result, the alignment signal is too weak or the noise ratio is too strong, which makes the alignment signal indiscernible by the alignment sensor and misalignment thus occurs.

FIGS. 1A–1E are schematic, cross-sectional views illustrating fabrication of a semiconductor device according to prior process. Referring to FIG. 1A, a substrate 100 having an alignment mark 101 is provided and a pad oxide layer 102 is formed thereon. A silicon nitride layer 104 serving as a mask layer is formed on the pad oxide layer 102. Since the alignment mark 101 formed within the substrate 100 has at least a depression 150 and there is a step height 170 between the surface 103 of the substrate 100 and the alignment mark 150, a recess 105 is therefore formed within the silicon nitride layer 104 above the alignment mark 101.

Referring to FIG. 1B, the silicon nitride layer 104 is patterned by photolithographic technique to form a patterned silicon nitride layer 104a, and the pad oxide layer 102 and the substrate 100 are successively etched using the silicon nitride layer 104a as a hard mask. A trench 108 is formed within the substrate 100.

Referring to FIG. 1C, a liner oxide layer 110 is formed on the exposed substrate 100 within the trench 108. A silicon oxide layer 112 is then formed to fill the trench 108. Since the step height 170 between the alignment mark 101 and the surface 103 of the substrate 100 is smaller than the depth 180 of the trench, the recess 105 within the silicon nitride layer 104a above the alignment mark 101 can be filled with the silicon oxide layer 112 when the trench 108 is filled with the silicon oxide layer 112.

Referring to FIG. 1D, the silicon nitride layer 104a is used as a stop layer, the silicon oxide layer 112 on the silicon nitride layer 104a is removed by chemical-mechanical polishing (CMP) and a portion of the silicon oxide layer 112a is left in the trench 108. During CMP process, the silicon oxide layer 126 in the recess 105 also remains.

Referring to FIG. 1E, the silicon nitride layer 104a is removed to expose the pad oxide layer 102a, and the pad oxide layer 102a is then removed in a HF solution. The remaining silicon oxide layer 112a and the liner oxide layer 110 in the trench 108 serve as an isolation region 114.

The etching rate of the silicon oxide layer 112b is different from the etching rate of the silicon nitride layer 104a. During the process for etching the silicon nitride layer 104a, the silicon oxide layer 112b serves as a hard mask, which makes the silicon nitride layer 104a under the silicon oxide layer 112b difficult to remove. The silicon oxide layer 112b can be removed by the HF solution for etching the pad oxide layer 102a, but the etching time in the HF solution is too short to completely remove the desired thickness of the silicon oxide layer 112b. Therefore, the step height 170 in the depression 150 is not high enough due to the residual silicon oxide layer 112b and the silicon nitride layer 104a in the recess 105, and this causes misalignment.

In addition, the silicon oxide layer 112b can be removed by prolonging the etching time when the pad oxide layer 102a is removed by the HF solution. However, because the etching time for etching the silicon oxide layer 112b is hard to control, the silicon oxide layer 112a within the trench 108 is hence easily over-etched to cause damage to the isolation region 114.

Referring to FIG. 1F and FIG. 1G, in order to avoid the planarized silicon oxide layer 112b covering the alignment mark 101 during STI process, a photoresist layer 116 is further formed over the substrate 100. The silicon oxide layer 112b in the recess 105 is removed in a HF solution. The photoresist layer 116 is then stripped, and the silicon nitride layer 104a and the silicon oxide layer 102a are removed successively. The alignment mark 101 is reconstructed. However, it is necessary to provide an additional mask to reconstruct the alignment mark and as a result, the fabricating time for etching is increased and the cost is also raised.

SUMMARY OF THE INVENTION

It is therefore an object of the invention to provide a method in which the residual material above the alignment mark can be removed after global planarization during STI process, and the alignment mark can be reconstructed without an additional mask.

To achieve these objects and advantages, and in accordance with the purpose of the invention, as embodied and broadly described herein, the invention is directed towards a method of reconstructing an alignment mark during a shallow trench isolation process. A mask layer is formed on the substrate and a cap layer is further formed to fill a recess within the mask layer above the alignment mark. A trench is then formed within the substrate. An insulating layer is formed to fill the trench and a CMP process is carried out to globally planarize the wafer until exposing the mask layer. The cap layer, the mask layer and the pad oxide layer are then successively removed. An isolation region is therefore formed in the trench and the alignment mark can be reconstructed.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
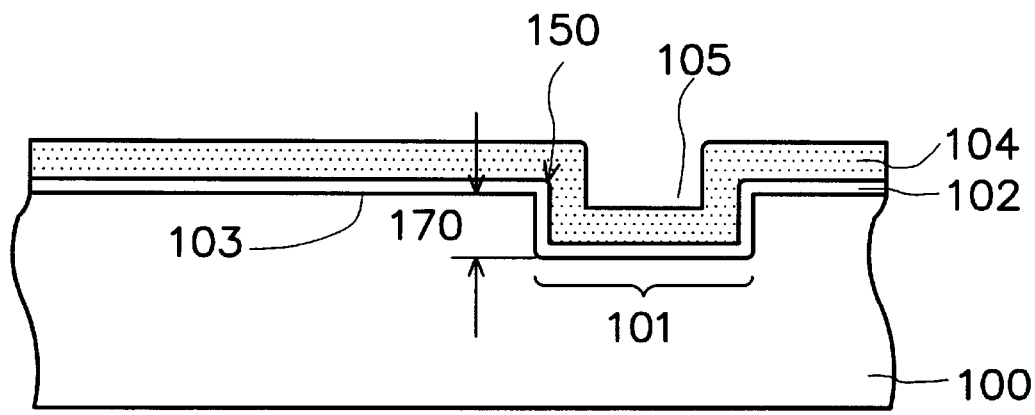
FIGS. 1A–1G are schematic, cross-sectional views illustrating fabrication of a semiconductor device of prior process known in prior art.
Figure 1B:
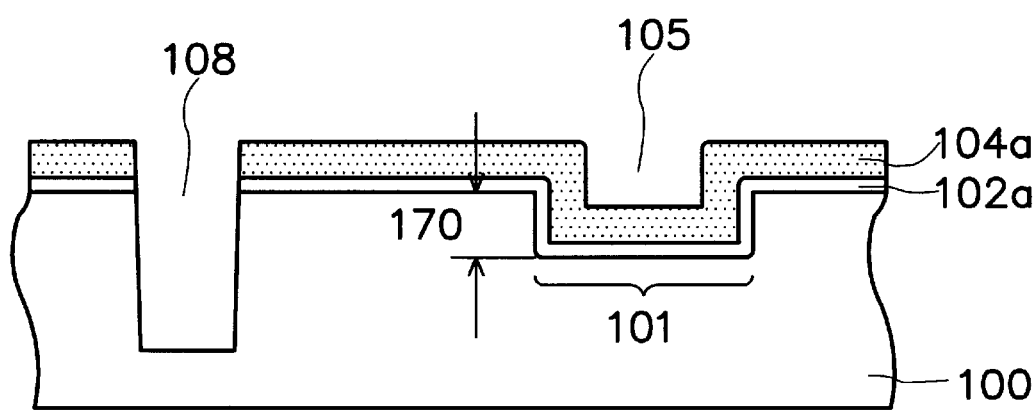
Figure 1C:
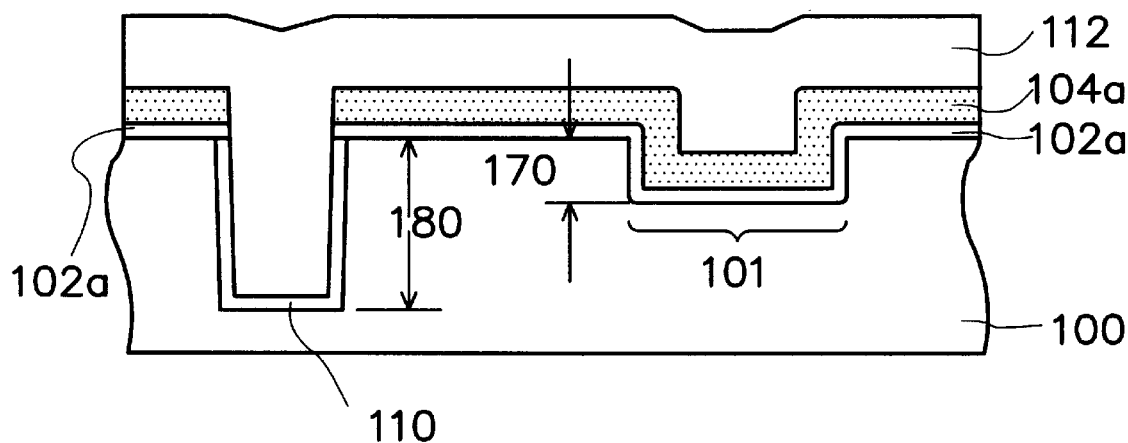
Figure 1D:
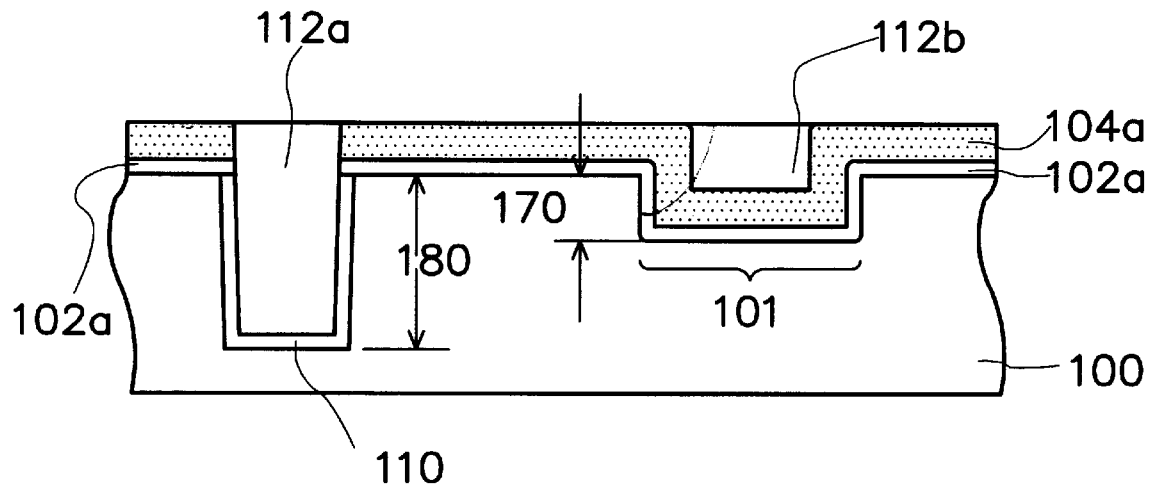
Figure 1E:
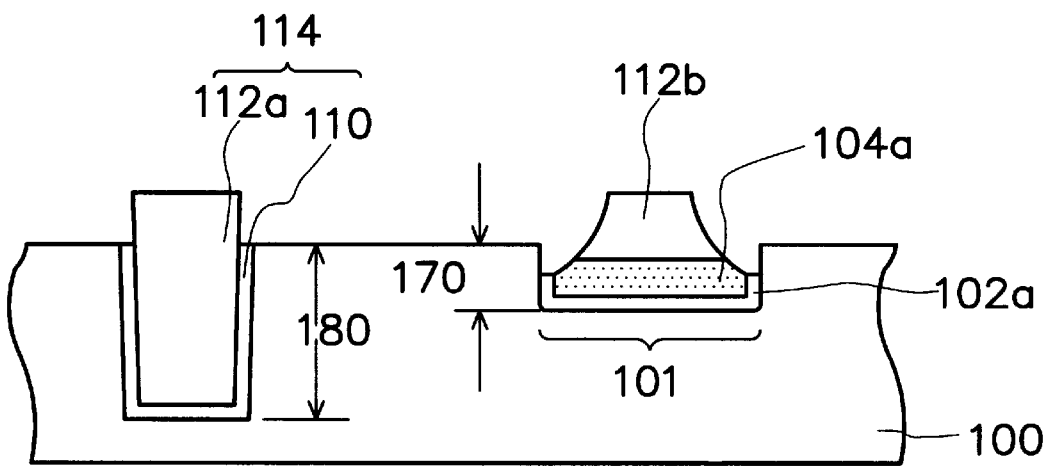
Figure 1F:
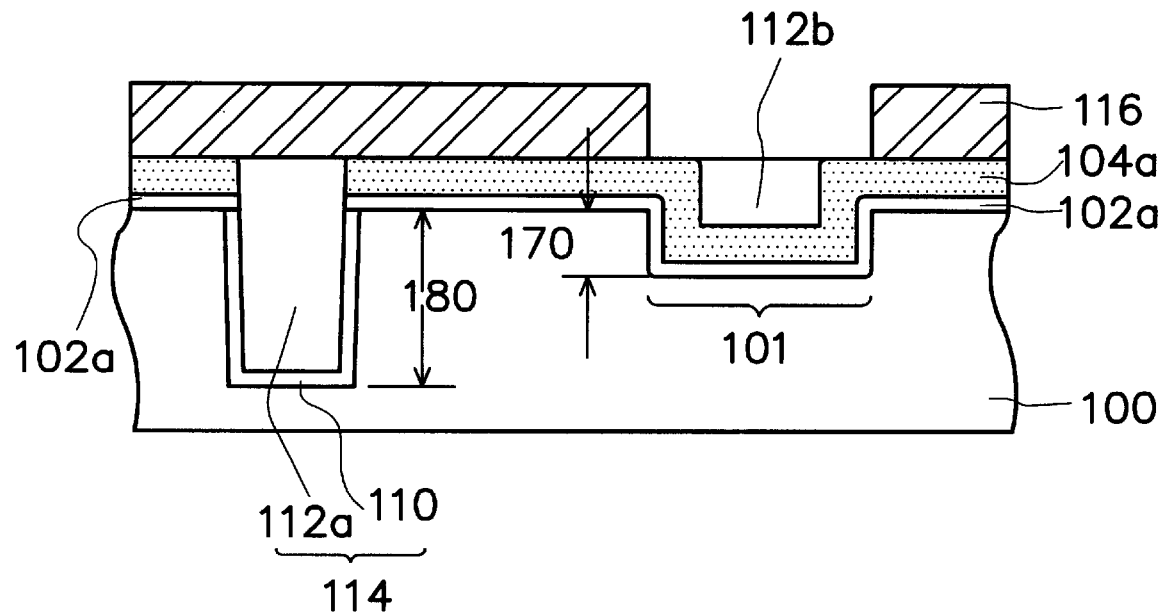
Figure 1G:
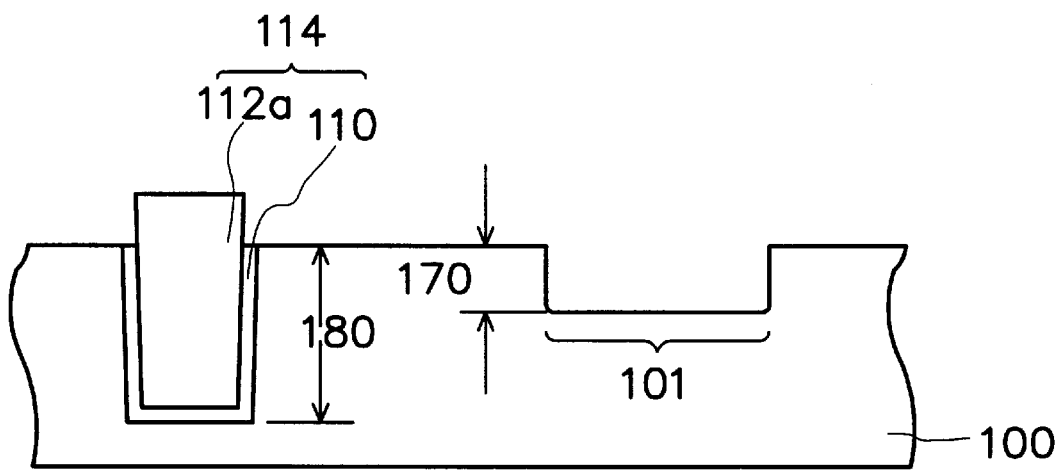
Figure 2A:
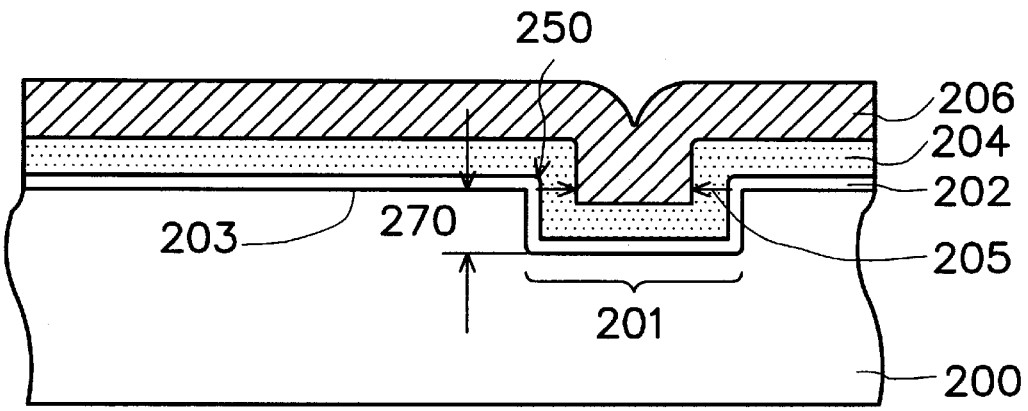
FIGS. 2A–2F are schematic, cross-sectional views illustrating reconstruction of an alignment mark during the formation of the STI in a preferred embodiment according to the invention.

Referring to FIG. 2A, a substrate 200 having an alignment mark 201 is provided and a pad oxide layer 202 is thermally formed on the substrate 200 to protect the substrate 200 from being damaged during the subsequent fabrication. A mask layer 204 is then formed on the pad oxide layer 202 and subsequently serves as an etching mask in the formation of the trench within the substrate 200. The alignment mark 201 has at least a depression 205 formed within the substrate 200 and the depression 250 has a step height 270 with the surface 203 of the substrate 200. The mask layer 204 above the alignment mark 201 has at least a recess 205 formed thereon due to the depression 250. The recess 205 is filled with a cap layer 206 formed over the substrate 200. The pad oxide layer 202 can be formed by thermal oxidation. The material of the mask layer 204 includes a silicon nitride layer formed by low-pressure chemical vapor deposition (LPCVD). The cap layer 206 has a different etching rate from that of the mask layer 204 and the isolation region subsequently formed, such that the cap layer 206 includes silicon-oxy-nitride, polysilicon or amorphous silicon and is formed by a process such as CVD.

Figure 2B:
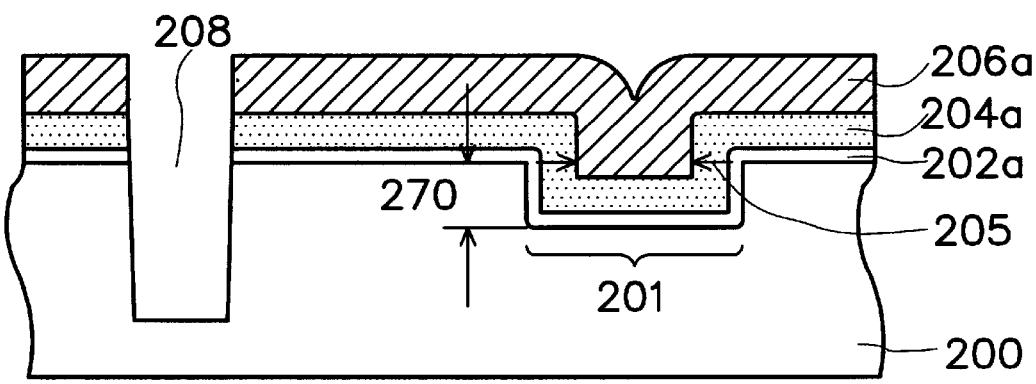

Referring to FIG. 2B, the cap layer 206, the mask layer 204 and the pad oxide layer 202 are patterned by conventional photolithographic technique, and a trench 208 is formed within the substrate 200. A photoresist layer (not shown) is formed over the substrate 200, and the cap layer 206 and the mask layer 204 are etched by dry etching to form the patterned cap layer 206a and mask layer 204a. The pad oxide layer 202 and the substrate 200 are successively etched to form the trench 208 within the substrate 200. The photoresist layer is then stripped.

Figure 2C:
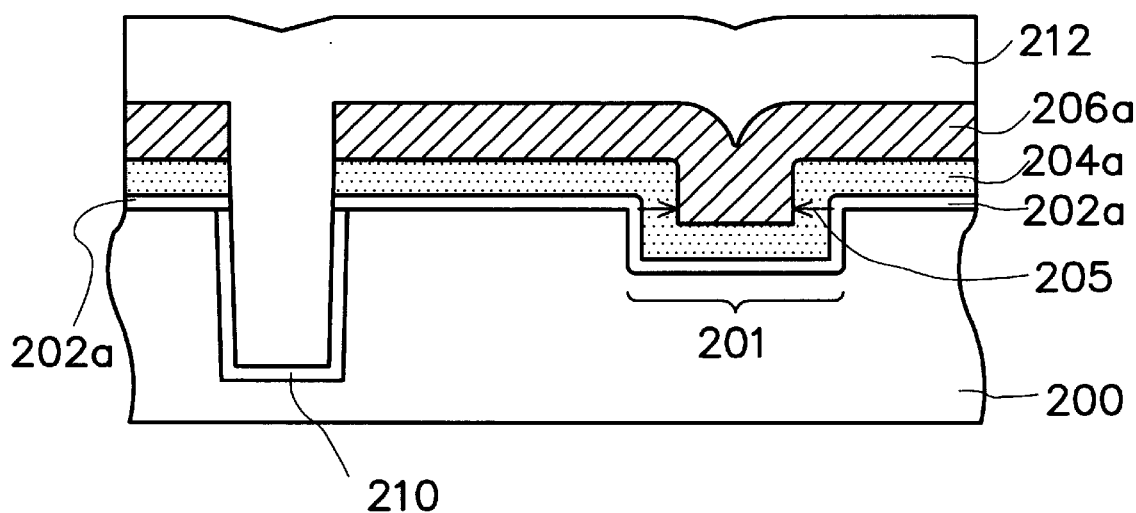

Referring to FIG. 2C, a liner oxide layer 210 is formed on the exposed substrate 200 within the trench 208 by a process such as thermal oxidation. An insulating layer 212 including silicon oxide is formed to fill the trench 208. The silicon oxide is formed by atmospheric pressure chemical vapor deposition (APCVD) and then densified at a high temperature to form a dense silicon oxide layer 212. Since the recess 205 above the mask layer 204a is filled with the cap layer 206a, the insulating layer 212 formed on the substrate 200 cannot fill the recess 205.

Figure 2D:
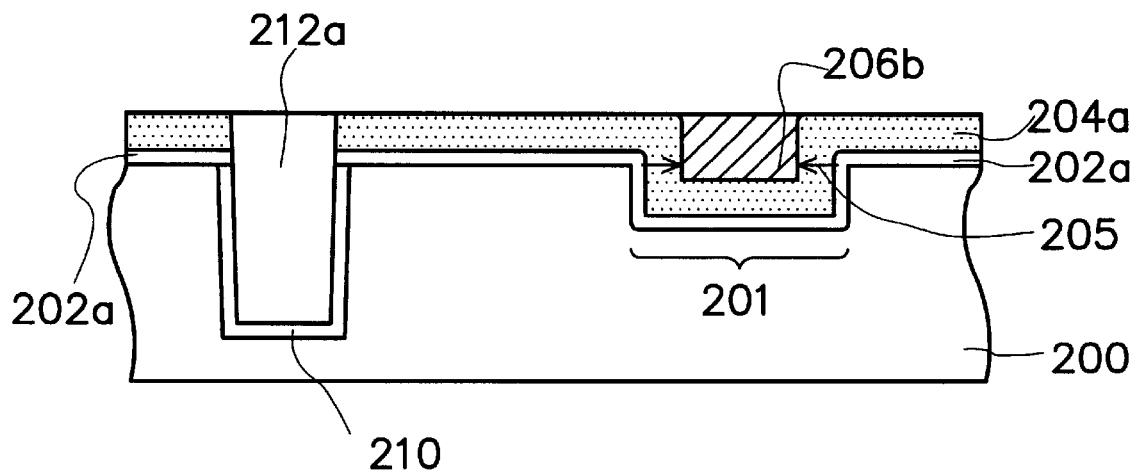

Referring to FIG. 2D, the cap layer 206a and the insulating layer 212 are removed from the mask layer 204a to globally planarize the wafer. A portion of the cap layer 206b and the insulating layer 212a respectively remain in the recess 205 and the trench 208. Using the cap layer 206b as a stop layer, the insulating layer 212 on the cap layer 206a is removed by CMP. CMP is carried out to remove the cap layer 206a on the mask layer 204a while using the mask layer 204a as a stop layer, and thus the insulating layer 212a and the cap layer 206b are left inside the trench 208 and the recess 205, respectively. Since the recess 205 is completely covered by the cap layer 206b, the insulating layer 212 does not remain in the recess 205 after planarization. Therefore, the problem as seen in prior art where the insulating layer is left in the recess 205 can be avoided.

Figure 2E:
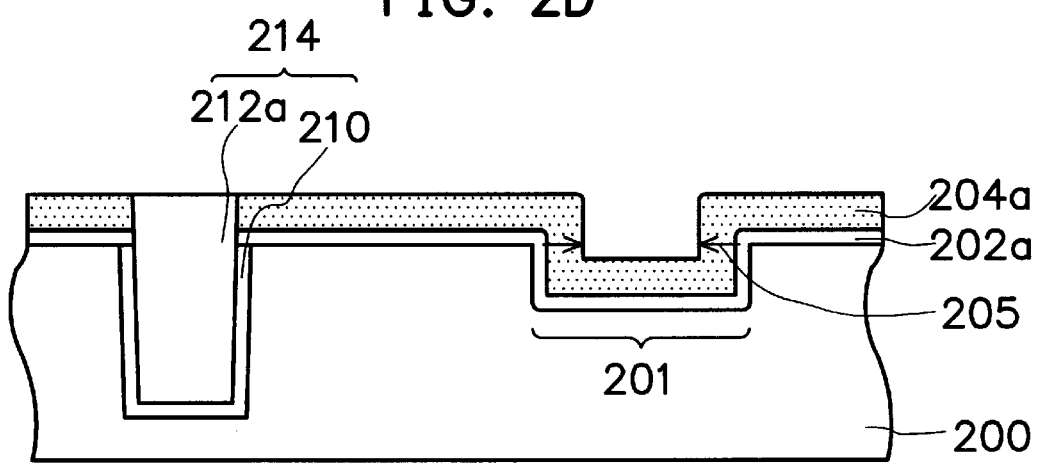

Referring to FIG. 2E, the cap layer 206b is removed to expose the recess 205. The method to remove the cap layer 206b includes anisotropic etching such as reactive ion etching (RIE) and isotropic etching such as wet etching. The etching rate of the cap layer 206b is different from that of the insulating layer 212a and the mask layer 204a, so that the cap layer 206b can be selectively removed. Because the etching conditions to remove the cap layer 206b in the foregoing step are used, the insulating layer 212a in the trench 208 is not damaged by etching.

Figure 2F:
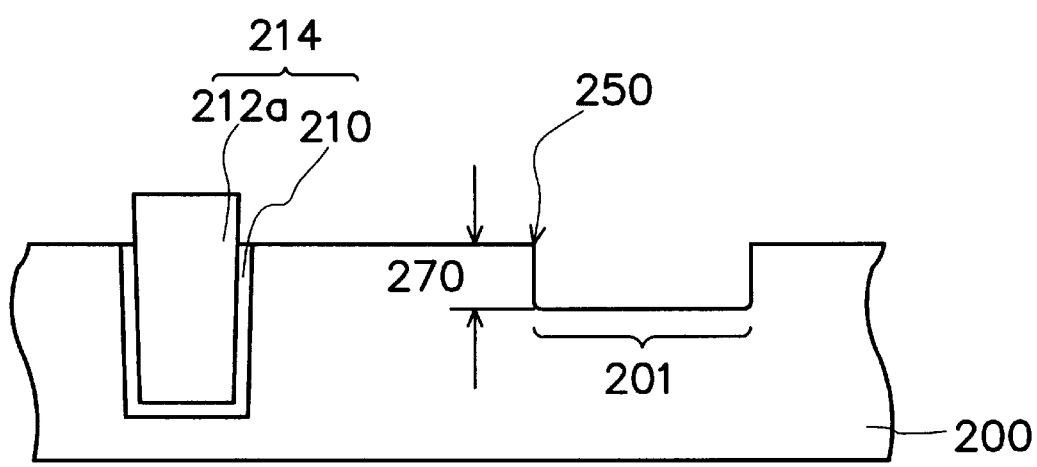

Referring to FIG. 2F, the mask layer 204a and the pad oxide layer 202a are removed successively to expose the depression 250 and the alignment mark 201 thus reappears. The remaining insulating layer 212a and the liner oxide layer 210 within the substrate 200 serve as an isolation region 214. The mask layer 204a can be removed isotropically by wet etching in a hot phosphoric acid, and the pad oxide layer 202a is then exposed. The pad oxide layer 202a is removed in HF solution and the alignment mark 201 is reconstructed.

Figure 3A:
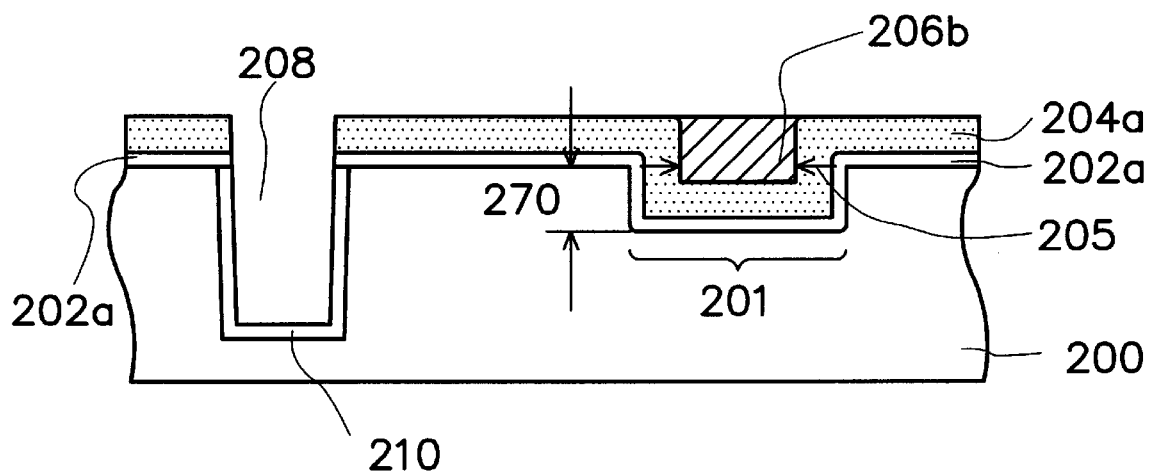
FIGS. 3A–3B are schematic, cross-sectional views illustrating reconstruction of an alignment mark during the formation of the STI after FIG. 2A in a preferred embodiment according to the invention and its result is shown in FIG. 2D.
Figure 3B:
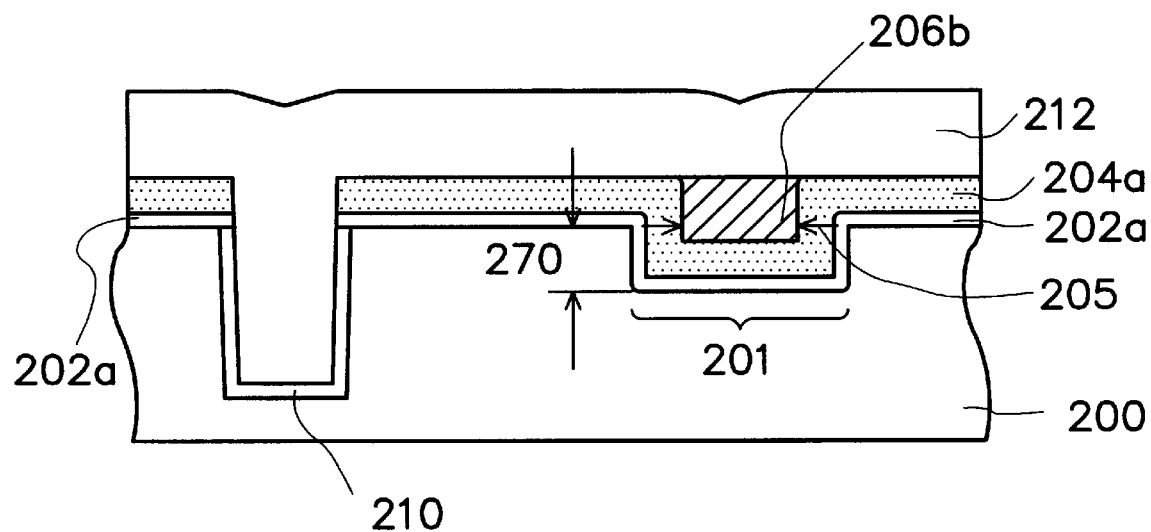

The result as shown in FIG. 2D can be achieved by the fabricating method as shown in FIGS. 3A–3B when the pad oxide layer 202, the mask layer 204 and the cap layer 206 are formed on the substrate 200, as shown in FIG. 2A.

Referring to FIG. 3A, a portion of the cap layer 206 is removed to planarize the wafer and the remaining cap layer 206b covers the recess 205. The mask layer 204 and the pad oxide layer 202 are patterned to form a trench 208 within the substrate 200. Using the mask layer 204 as a stop layer, a CMP process is performed to remove a portion of the cap layer 206, and the cap layer 206b is only left in the recess 205. A photoresist layer (not shown) is formed on the mask layer 204 and the mask layer 204 is patterned by dry etching. The pad oxide layer 202 and the substrate 200 are successively etched to form pad oxide layer 202a when the mask layer 204a serves as a hard mask. A trench 208 is therefore formed with the substrate 200.

Referring to FIG. 3B, a liner oxide layer 210 is formed on the exposed substrate 200 within the trench 208 by a process such as thermal oxidation. An insulating layer 212 including silicon oxide is formed to fill the trench 208. The silicon oxide is formed by atmospheric pressure chemical vapor deposition (APCVD) and then densified at a high temperature to form a dense silicon oxide layer 212. Since the recess 205 above the mask layer 204a is filled with the cap layer 206b, the insulating layer 212 formed on the substrate 200 cannot fill the recess 205.

Referring back to FIG. 2D, the cap layer 206a and the insulating layer 212 are removed from the mask layer 204a to globally planarize the wafer in FIG. 3B. A portion of the cap layer 206b and the insulating layer 212a respectively remain in the recess 205 and the trench 208. Using the cap layer 206b as a stop layer, the insulating layer 212 on the cap layer 206a is removed by CMP. CMP is carried out to remove the cap layer 206a on the mask layer 204a while using the mask layer 204a as a stop layer, and thus the trench 208 and the recess 205 have insulating layer 212a and cap layer 206b left inside, respectively. Since the recess 205 is completely covered by the cap layer 206a, the insulating layer 212 does not remain in the recess 205 after planarization. Therefore, the problem as seen in prior art where the insulating layer is left in the recess 205 can be avoided.

As described above, this invention includes some features:

1. The alignment mark within the substrate can be reconstructed without additional photolithographic technique and exposure. Therefore, both the fabricating time and the cost can be reduced to enhance the throughput of the products.
2. The insulating layer in the STI is not over-etched and damaged when the pad oxide layer is over etched to remove the remaining insulating layer above the alignment mark.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of reconstructing an alignment mark during STI process, comprising:
   providing a semiconductor substrate having at least a depression, which serves as an alignment mark;
   forming a pad oxide layer on the substrate;
   forming a mask layer on the pad oxide layer wherein a recess within the mask layer is above the depression;
   forming a cap layer to fill the recess;
   forming a trench within the substrate;
   forming an insulating layer to at least fill the trench;
   performing a planarization process until exposing the mask layer;
   removing the cap layer;
   removing the mask layer; and
   removing the pad oxide layer;
   wherein the material of the cap layer is different from that of the insulating layer.

2. The method according to claim 1, wherein the cap layer, the insulating layer and the mask layer have different etching rates.

3. The method according to claim 2, wherein the cap layer is selected from a group consisting of silicon-oxy-nitride, polysilicon and amorphous silicon.

4. The method according to claim 2, wherein the mask layer includes silicon nitride.

5. The method according to claim 2, wherein the insulating layer includes silicon oxide.

6. The method according to claim 1, wherein after the step of forming a trench within the substrate and before the step of forming the insulating layer further comprises forming a liner oxide layer on the exposed substrate within the trench.

7. The method according to claim 1, wherein the planarization process is performed by chemical-mechanical polishing (CMP).

8. The method according to claim 1, wherein removing the cap layer includes reactive ion etching (RIE).

9. A method of reconstructing an alignment mark during STI process, comprising:
   providing a semiconductor substrate having a depression, which serves as an alignment mark;
   forming a pad oxide layer on the substrate;
   forming a mask layer on the pad oxide layer wherein a recess within the mask layer is above the depression;
   forming a cap layer to cover the mask layer and fill the recess;
   removing a portion of the cap layer by CMP, wherein a portion of the cap layer is left in the recess;
   patterning the mask layer and the pad oxide layer to form a trench within the substrate;
   forming a liner oxide layer on the exposed substrate within the trench;
   forming an insulating layer to at least fill the trench;
   performing a CMP process to remove the insulating layer from the cap layer and the mask layer, wherein a portion of the insulating layer remains in the trench;
   removing the cap layer;
   removing the mask layer; and
   removing the pad oxide layer;
   wherein the material of the cap layer is different from that of the insulating layer.

10. The method according to claim 9, wherein the cap layer, the insulating layer and the mask layer have different etching rates.

11. The method according to claim 10, wherein the cap layer is selected from a group consisting of silicon-oxy-nitride, polysilicon and amorphous silicon.

12. The method according to claim 10, wherein the mask layer includes silicon nitride.

13. The method according to claim 10, wherein the insulating layer includes silicon oxide.

14. The method according to claim 9, wherein removing the cap layer includes reactive ion etching (RIE).

15. A method of reconstructing an alignment mark during STI process, comprising:
    providing a semiconductor substrate having a depression, which serves as an alignment mark;
    forming a pad oxide layer on the substrate;
    forming a mask layer on the pad oxide layer wherein a recess within the mask layer is above the depression;
    forming a cap layer to cover the mask layer and fill the recess;
    patterning the mask layer and the pad oxide layer to form a trench within the substrate;
    forming a liner oxide layer on the exposed substrate within the trench;
    forming an insulating layer to at least fill the trench;
    removing the insulating layer until the mask laver is exposed, so that a portion of the insulating layer and a portion of the cap layer respectively remain in the trench and the recess;
    removing the cap layer;
    removing the mask layer; and
    removing the pad oxide layer;
    wherein the material of the cap layer is different from that of the insulating layer.

16. The method according to claim 15, wherein the cap layer, the insulating layer and the mask layer have different etching rates.

17. The method according to claim 15, wherein the cap layer is selected from a group consisting of silicon-oxy-nitride, polysilicon and amorphous silicon.

18. The method according to claim 16, wherein the mask layer includes silicon nitride.

19. The method according to claim 16, wherein the insulating layer includes silicon oxide.

20. The method according to claim 15, wherein removing the cap layer includes reactive ion etching (RIE).

* * * * *